(12) United States Patent
Jeon et al.

(10) Patent No.: US 8,445,909 B2
(45) Date of Patent: May 21, 2013

(54) SENSOR ARRAY SUBSTRATE AND METHOD OF FABRICATING THE SAME

(75) Inventors: Kyung-Sook Jeon, Yongin-si (KR);
Jun-Ho Song, Seongnam-si (KR);
Sang-Youn Han, Seoul (KR);
Sung-Hoon Yang, Seoul (KR);
Dae-Cheol Kim, Hwaseong-si (KR);
Ki-Hun Jeong, Cheonan-si (KR);
Mi-Seon Seo, Seoul (KR)

(73) Assignee: Samsung Display Co., Ltd., Yongin (KR)

( * ) Notice: Subject to any disclaimer, the term of this patent is extended or adjusted under 35 U.S.C. 154(b) by 208 days.

(21) Appl. No.: 13/102,824

(22) Filed: May 6, 2011

(65) Prior Publication Data
US 2012/0025189 A1    Feb. 2, 2012

(30) Foreign Application Priority Data
Jul. 29, 2010   (KR) .................. 10-2010-0073499

(51) Int. Cl.
*H01L 29/04*    (2006.01)
(52) U.S. Cl.
USPC ............. 257/53; 257/43; 257/52; 257/57; 257/59; 257/60; 438/104; 438/152; 438/155; 438/158; 438/166

(58) Field of Classification Search
None
See application file for complete search history.

(56) References Cited

U.S. PATENT DOCUMENTS
6,445,003 B1 *   9/2002   Chang et al. .............. 257/59

FOREIGN PATENT DOCUMENTS
| JP | 2000-122574 | 4/2000 |
| KR | 10-0841244 | 6/2008 |
| KR | 10-0911460 | 8/2009 |

* cited by examiner

*Primary Examiner* — Kyoung Lee
(74) *Attorney, Agent, or Firm* — H.C. Park & Associates, PLC

(57) ABSTRACT

Provided are a sensor array substrate and a method of fabricating the same. The sensor array substrate includes: a substrate in which a switching element region and a sensor region that senses light are defined; a first semiconductor layer which is formed in the sensor region; a first gate electrode which is formed on the first semiconductor layer and overlaps the first semiconductor layer; a second gate electrode which is formed in the switching element region; a second semiconductor layer which is formed on the second gate electrode and overlaps the second gate electrode; and a light-blocking pattern which is formed on the second semiconductor layer and overlaps the second semiconductor layer, wherein the first semiconductor layer and the second semiconductor layer are disposed on different layers, and the second gate electrode and the light-blocking pattern are electrically connected to each other.

31 Claims, 10 Drawing Sheets

SENSOR ARRAY SUBSTRATE AND METHOD OF FABRICATING THE SAME

CROSS REFERENCE TO RELATED APPLICATION

This application claims priority from and the benefit of Korean Patent Application No. 10-2010-0073499, filed on Jul. 29, 2010, which is hereby incorporated by reference for all purposes as if fully set forth herein.

BACKGROUND OF THE INVENTION

1. Field of the Invention

Exemplary embodiments of the present invention relate to a sensor array substrate fabricated using a reduced number of masks and a method of fabricating the sensor array substrate.

2. Discussion of the Background

Display devices including a sensor array substrate can be touched with a finger or pen to input data. According to their operating principles, display devices including a sensor array substrate are classified into resistive display devices, capacitive display devices, optical sensor display devices, and the like.

Resistive display devices operate by sensing the contact between electrodes which occurs when a pressure exceeding a predetermined level is applied onto the electrodes. Capacitive display devices operate by sensing a change in capacitance that results from the touch of a finger.

SUMMARY OF THE INVENTION

Exemplary embodiments of the present invention provide a sensor array substrate fabricated using a reduced number of masks and in a simplified process.

Exemplary embodiments of the present invention also provide a method of fabricating a sensor array substrate by using a reduced number of masks.

Additional features of the invention will be set forth in the description which follows, and in part will be apparent from the description, or may be learned by practice of the invention.

An exemplary embodiment of the present invention discloses a sensor array substrate including: a substrate in which a switching element region and a sensor region that senses light are defined; a first semiconductor layer which is formed in the sensor region; a first gate electrode which is formed on the first semiconductor layer and overlaps the first semiconductor layer; a second gate electrode which is formed in the switching element region; a second semiconductor layer which is formed on the second gate electrode and overlaps the second gate electrode; and a light-blocking pattern which is formed on the second semiconductor layer and overlaps the second semiconductor layer, wherein the first semiconductor layer and the second semiconductor layer are disposed on different layers, and the second gate electrode and the light-blocking pattern are electrically connected to each other.

An exemplary embodiment of the present invention also discloses a method of fabricating a sensor array substrate. The method includes: providing a substrate in which a switching element region and a sensor region that senses light are defined; forming a first semiconductor layer in the sensor region; forming a first gate electrode on the first semiconductor layer to overlap the first semiconductor layer; forming a second gate electrode in the switching element region; forming a second semiconductor layer on the second gate electrode to overlap the second gate electrode; and forming a light-blocking pattern on the second semiconductor layer to overlap the second semiconductor layer, wherein the first semiconductor layer and the second semiconductor layer are disposed on different layers, and the second gate electrode and the light-blocking pattern are electrically connected to each other.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
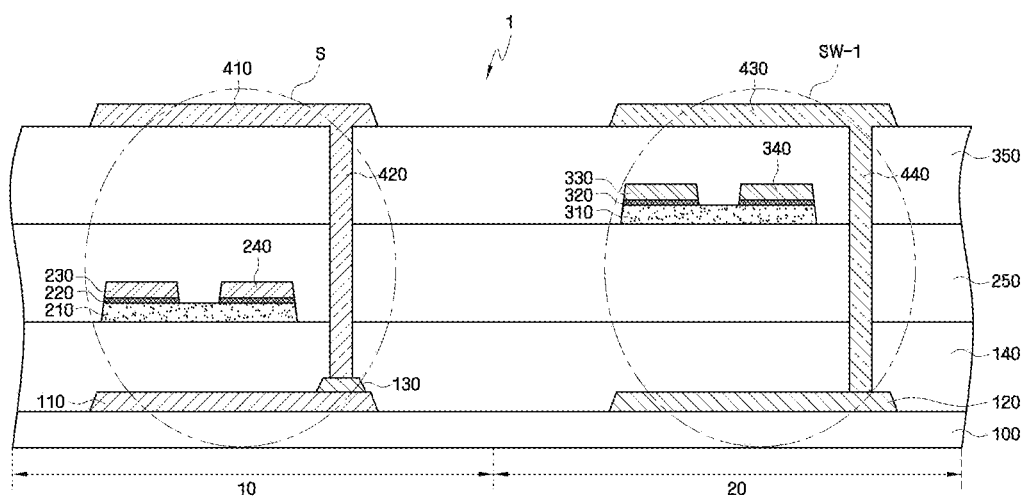
FIG. 1 is a first cross-sectional view of a sensor array substrate according to a first exemplary embodiment of the present invention.

Advantages and features of the present invention and methods of accomplishing the same may be understood more readily by reference to the following detailed description of exemplary embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification.

It will be understood that when an element or layer is referred to as being "on" or "connected to" another element or layer, it can be directly on or directly connected to the other element or layer, or intervening elements or layers may be present. In contrast, when an element or layer is referred to as being "directly on" or "directly connected to" another element or layer, there are no intervening elements or layers present. As used herein, the term "and/or" includes any and all combinations of one or more of the associated listed items.

Spatially relative terms, such as "below", "beneath", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation, in addition to the orientation depicted in the figures.

Embodiments of the invention are described herein with reference to plan and cross-section illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a sensor array substrate and a method of fabricating the same according to exemplary embodiments of the present invention will be described with reference to the attached drawings.

Figure 2:
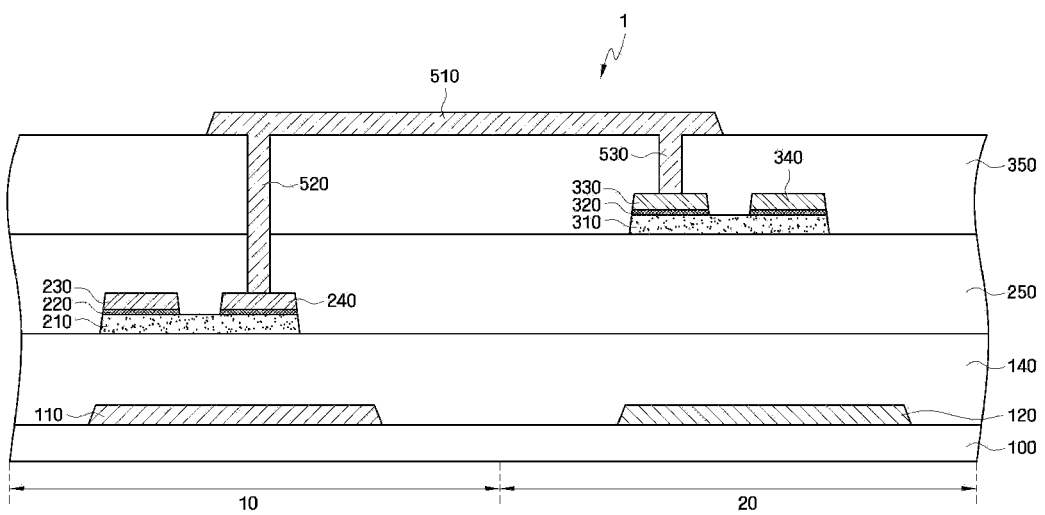
FIG. 2 is a second cross-sectional view of the sensor array substrate according to the first exemplary embodiment of the present invention.

First, a sensor array substrate according to a first exemplary embodiment of the present invention will be described with reference to FIGS. 1 and 2. FIG. 1 is a first cross-sectional view of a sensor array substrate 1 according to a first exemplary embodiment of the present invention. FIG. 2 is a second cross-sectional view of the sensor array substrate 1 according to the first exemplary embodiment of the present invention.

Referring to FIGS. 1 and 2, the sensor array substrate 1 according to the first exemplary embodiment may include various elements such as a sensor unit S formed in a sensor region 10 of a substrate 100 and a first switching unit SW-1 formed in a switching element region 20 of the substrate 100. Here, the sensor region 10 and the switching element region 20 are defined in the substrate 100.

The substrate 100 may be made of various materials including glass, such as soda lime glass or boro silicate glass, or plastic.

The sensor unit S formed in the sensor region 10 of the substrate 100 will now be described. The sensor unit S according to the current exemplary embodiment of the present invention may include a sensor (detector) that senses (detects) light in a visible wavelength range or an infrared wavelength range. For the sake of descriptive convenience, it will be assumed that the sensor unit S shown in FIGS. 1 and 2 includes a sensor that senses light in the infrared wavelength range, unless otherwise stated.

Referring to FIG. 1, a light-blocking film 110 is formed in the sensor region 10 of the substrate 100. The light-blocking film 110 prevents light in the visible wavelength range from entering a first semiconductor layer 210 while allowing light in the infrared wavelength range to transmit therethrough. That is, the light-blocking film 110 functions as a filter that filters out light in the visible wavelength range.

To sense light in the infrared wavelength range, the first semiconductor layer 210 of the sensor unit S should contain a material having a smaller band gap than that of a material that it contains when sensing light in the visible wavelength range. In this case, if light in the visible wavelength range is incident on the first semiconductor layer 210, the first semiconductor layer 210 may react to the light in the visible wavelength range, thereby generating a signal. That is, the sensor unit S, which should sense light in the infrared wavelength range only, may also sense light in the visible wavelength range. The light-blocking layer 110 may prevent this malfunction of the sensor unit S caused by light in the visible wavelength range.

When light in the visible wavelength range is incident on the light-blocking film 110, the light-blocking film 110 may generate a signal due to a photovoltaic effect. Accordingly, the light in the visible wavelength range can be prevented from entering the first semiconductor layer 210. The light-blocking film 110 may be made of Ge/SiGe, SiNx/SiGe formed at relatively high speed, or SiGe. That is, the Ge/SiGe, SiNx/SiGe may be formed at a relatively high speed by a physical vapor deposition process such as vacuum spraying, sputtering, ion plating, etc., or by a chemical vapor deposition (CVD) process such as a plasma CVD process, etc. In addition, the light-blocking film 110 may be made of a material having a relatively larger band gap than that of the material of the first semiconductor layer 210 so as to transmit light in the infrared wavelength range while blocking light in the visible wavelength range.

The light-blocking film 110 may be formed as an island-shaped pattern and may be overlapped by the first semiconductor layer 210 to prevent light in the visible wavelength range from entering the first semiconductor layer 210. Here, the boundary of the first semiconductor layer 210 may be located within the boundary of the light-blocking film 110. In other words, the entire footprint of the first semiconductor layer 210 may be located within the entire footprint of the light-blocking film 110.

Although not shown in the drawings, an ohmic contact layer (not shown) may be formed on the light-blocking film 110 to contact a first gate electrode 410 or a bias voltage application pattern 130 which will be described later. The ohmic contact layer may reduce contact resistance between the light-blocking film 110 and the first gate electrode 410 or the bias voltage application pattern 130.

If the sensor unit S is a sensor that senses light in the visible wavelength range, light in the visible wavelength range should enter the sensor unit S. Accordingly, the first semiconductor layer 210 may be made of a material having a relatively large band gap and thus may not react to light in the infrared wavelength range. In this case, the light-blocking film 110 may not be formed in the sensor region 10 of the substrate 100.

The bias voltage application pattern 130 may be formed on a side of a top surface of the light-blocking film 110. The bias voltage application pattern 130 is electrically connected to the first gate electrode 410, which will be described later, in order to apply a bias voltage to the light-blocking film 110. When the light-blocking film 110 absorbs light in the visible wavelength range, a voltage may be generated in the light-blocking film 110 due to the photovoltaic effect, and the generated voltage may cause the light-blocking film 110 to function as a gate electrode of the sensor unit S. In this case, the sensor unit S is highly likely to malfunction. To remove the voltage generated in the light-blocking film 110 so as to prevent the malfunction of the sensor unit S, a bias voltage is applied to the light-blocking film 110 via the first gate electrode 410. Here, the bias voltage application pattern 130 formed on the top surface of the light-blocking film 110 enhances contact resistance characteristics between the light-blocking film 110 and the first gate electrode 410. The ohmic contact layer (not shown) may be formed between the light-blocking film 110 and the bias voltage application pattern 130 to improve contact characteristics between the light-blocking film 110 and the bias voltage application pattern 130.

The bias voltage application pattern 130 may be made of the same material as a second gate electrode 120, which will be described later.

A first interlayer insulating layer 140 is formed on the light-blocking film 110 and the bias voltage application pattern 130. The first interlayer insulating layer 140 may be made of, but is not limited to, an inorganic insulating material, such as SiOx or SiNx, or an organic insulating material such as benzocyclobutene (BCB), an acrylic material, or polyimide.

The first semiconductor layer 210 is formed on a region of a top surface of the first interlayer insulating layer 140 which corresponds to the sensor region 10. The first semiconductor layer 210 absorbs light in the infrared or visible wavelength range and converts the absorbed light into an electrical signal, thereby sensing the light in the infrared or visible wavelength range.

To this end, the first semiconductor layer 210 may have a single-film or multi-film structure containing at least one of amorphous silicon (a-Si), amorphous silicon germanium (a-SiGe), microcrystalline silicon (mc-Si), and semiconductor oxide.

Specifically, when the sensor unit S senses light in the infrared wavelength range, the first semiconductor layer 210 may contain at least one of a-SiGe, mc-Si, and semiconductor oxide. On the other hand, when the sensor unit S senses light in the visible wavelength range, the first semiconductor layer 210 may contain at least one of a-Si, a-SiGe, mc-Si, and semiconductor oxide, all of which have a larger band gap than those of the above listed semiconductor materials. For example, when the sensor unit S senses light in the infrared wavelength range, the first semiconductor layer 210 may contain a-SiGe having a smaller band gap than that of a material that the sensor unit S contains when configured to sense light in the visible wavelength range.

An ohmic contact layer pattern 220 made of a material, such as silicide or n+ hydrogenated amorphous silicon doped with n-type impurities in high concentration, is disposed on the first semiconductor layer 210.

First data wirings are formed on the ohmic contact layer pattern 220. The first data wirings include a data line (not shown), a first source electrode 240, and a first drain electrode 230. The data line intersects a gate line (not shown), which includes the first gate electrode 410, to define a pixel. The first source electrode 240 branches from the data line and extends onto the first semiconductor layer 210. The first drain electrode 230 is separated from the first source electrode 240, is formed on the first semiconductor layer 210, and faces the first source electrode 240 with respect to the first gate electrode 410 or a channel region of the first semiconductor layer 210.

As shown in FIG. 1, the first data wirings may directly contact the ohmic contact layer pattern 220 to form an ohmic contact. Since the ohmic contact layer pattern 220 functions as an ohmic contact, the first data wirings may be a single layer made of a material having low resistance. For example, the first data wirings may be made of Cu, Al, Ti, or Ag.

In order to improve ohmic contact characteristics, the first data wirings (i.e., the data line and the first source and drain electrodes 240 and 230) may have a single-film or multi-film structure composed of a material or materials selected from Ni, Co, Ti, Ag, Cu, Mo, Al, Be, Nb, Au, Fe, Se, and Ta. Examples of the multi-film structure include a double film, such as Al/Mo, Ta/Al, Ni/Al, Co/Al, Mo (Mo alloy)/Cu, Mo (Mo alloy)/Cu, Ti (Ti alloy)/Cu, TiN (TiN alloy)/Cu, Ta (Ta alloy)/Cu, TiOx/Cu, Al/Nd or Mo/Nb, and a triple film such as Mo/Al/Mo, Ti/Al/Ti, Ta/Al/Ta, Ti/Al/TiN, Ta/Al/TaN, Ni/Al/Ni or Co/Al/Co.

A second interlayer insulating layer 250 and a third interlayer insulating layer 350 are formed on the first semiconductor layer 210 and the first data wirings. The second and third interlayer insulating layers 250 and 350 may be made of, but are not limited to, an inorganic insulating material, such as SiOx or SiNx, or an organic insulating material such as BCB, an acrylic material, or polyimide.

The first gate electrode 410 is disposed on a region of a top surface of the third interlayer insulating layer 350 which corresponds to the sensor region 10 and overlaps the first semiconductor layer 210.

The first gate electrode 410 may be made of Al-based metal such as Al and an Al alloy (Al, AlNd, AlCu, etc.), Ag-based metal such as Ag and an Ag alloy, Cu-based metal such as Cu and a Cu alloy, Mo-based metal such as Mo and a Mo alloy (Mo, MoN, MoNb, etc.), Cr, Ti, or Ta.

In addition, the first gate electrode 410 may have a multi-film structure composed of two conductive films (not shown) with different physical characteristics. One of the two conductive films may be made of metal with low resistivity, such as Al-based metal, Ag-based metal or Cu-based metal, in order to reduce a signal delay or a voltage drop of the first gate electrode 410. The other one of the conductive films may be made of a different material, in particular, a material having superior contact characteristics with indium tin oxide (ITO) and indium zinc oxide (IZO), such as Mo-based metal, Cr, Ti, or Ta. Examples of multi-film structures include a chrome lower film and an aluminum upper film, an aluminum lower film and a molybdenum upper film, and a titanium lower film and a copper upper film. However, the present invention is not limited thereto. The first gate electrode 410 may be made of various metals and conductors.

As described above, the first gate electrode 410 and the light-blocking film 110 are electrically connected to each other. The first gate electrode 410 and the light-blocking film 110 are electrically connected to each other by a first contact plug 420 which extends from a side of the first gate electrode 410 in the direction of the light-blocking film 110. To form the first contact plug 420, a first contact hole 402 (see FIG. 15) which exposes the light-blocking film 110 or the bias voltage application pattern 130 may be formed in the first interlayer insulating layer 140, the second interlayer insulating layer 250 and the third interlayer insulating layer 350. The first contact plug 420 may be made of the same material as the first gate electrode 410.

Next, the first switching unit SW-1 formed in the switching element region 20 of the substrate 100 will be described.

Referring to FIG. 1, the second gate electrode 120 is formed in the switching element region 20 of the substrate 100. The second gate electrode 120 may be formed on the same layer as the light-blocking film 110.

The second gate electrode 120 may be made of Al-based metal such as Al and an Al alloy (Al, AlNd, AlCu, etc.), Ag-based metal such as Ag and an Ag alloy, Cu-based metal such as Cu and a Cu alloy, Mo-based metal such as Mo and a Mo alloy (Mo, MoN, MoNb, etc.), Cr, Ti, or Ta.

In addition, the second gate electrode 120 may have a multi-film structure composed of two conductive films (not shown) with different physical characteristics. One of the two conductive films may be made of metal with low resistivity, such as Al-based metal, Ag-based metal or Cu-based metal, in order to reduce a signal delay or a voltage drop of the second gate electrode 120. The other one of the conductive films may be made of a different material, in particular, a material having superior contact characteristics with ITO and IZO, such as Mo-based metal, Cr, Ti, or Ta. Examples of multi-film structures include a chrome lower film and an aluminum upper film, an aluminum lower film and a molybdenum upper film, and a titanium lower film and a copper upper film. However, the present invention is not limited thereto. The second gate electrode 120 may be made of various metals and conductors.

The first and second interlayer insulating layers 140 and 250 are formed on the second gate electrode 120.

A second semiconductor layer 310 is formed on a region of a top surface of the second interlayer insulating layer 250 which corresponds to the switching element region 20. Here, the second semiconductor layer 310 may overlap the second gate electrode 120. The second semiconductor layer 310 may be made of a-Si.

The first semiconductor layer 210 performs the function of sensing light by converting the light into an electrical signal, and the second semiconductor layer 310 performs a switching function. Thus, the first semiconductor layer 210 and the second semiconductor layer 310 may be made of different semiconductor materials.

The first semiconductor layer 210 and the second semiconductor layer 310 may be disposed on different layers. Referring to FIG. 1, the first semiconductor layer 210 is disposed on the first interlayer insulating layer 140 while the second semiconductor layer 310 is disposed on the second interlayer insulating layer 250. On the contrary, the first semiconductor layer 210 may be disposed on the second interlayer insulating layer 250 while the second semiconductor layer 310 is disposed on the first interlayer insulating layer 140. That is, which of the first and second semiconductor layers 210 and 310 is closer to the substrate 100 does not matter as long as the first and second semiconductor layers 210 and 310 are disposed on different layers. When the first and second semiconductor layers 210 and 310 are disposed on different layers as described above, the sensor array substrate 1 can be formed without using a semiconductor layer damage preventing film (not shown) that was previously needed to form the first or second semiconductor layer 210 or 310. This enables a more economical fabrication process.

An ohmic contact layer pattern 320 made of a material, such as silicide or n+ hydrogenated amorphous silicon doped with n-type impurities in high concentration, is disposed on the second semiconductor layer 310.

Second data wirings are formed on the ohmic contact layer pattern 320. The second data wirings include a data line (not shown), a second source electrode 330, and a second drain electrode 340. The data line intersects a gate line (not shown), which includes the second gate electrode 120, to define a pixel. The second source electrode 330 branches from the data line and extends onto the second semiconductor layer 310. The second drain electrode 340 is separated from the second source electrode 330, is formed on the second semiconductor layer 310, and faces the second source electrode 330 with respect to the second gate electrode 120 or a channel region of the second semiconductor layer 310.

As shown in FIG. 1, the second data wirings may directly contact the ohmic contact layer pattern 320 to form an ohmic contact. Since the ohmic contact layer pattern 320 functions as an ohmic contact, the second data wirings may be a single layer made of a material having low resistance. For example, the second data wirings may be made of Cu, Al, Ti, or Ag.

In order to improve ohmic contact characteristics, the second data wirings (i.e., the data line and the second source and drain electrodes 330 and 340) may have a single-film or multi-film structure composed of a material or materials selected from Ni, Co, Ti, Ag, Cu, Mo, Al, Be, Nb, Au, Fe, Se, and Ta. Examples of the multi-film structure include a double film, such as Al/Mo, Ta/Al, Ni/Al, Co/Al, Mo (Mo alloy)/Cu, Mo (Mo alloy)/Cu, Ti (Ti alloy)/Cu, TiN (TiN alloy)/Cu, Ta (Ta alloy)/Cu, TiOx/Cu, Al/Nd or Mo/Nb, and a triple film such as Mo/Al/Mo, Ti/Al/Ti, Ta/Al/Ta, Ti/Al/TiN, Ta/Al/TaN, Ni/Al/Ni or Co/Al/Co.

Since the first and second semiconductor layers 210 and 310 are disposed on different layers, the first source electrode 240 and the second source electrode 330 may also be disposed on different layers.

The third interlayer insulating layer 350 is formed on the second semiconductor layer 310 and the second data wirings.

A light-blocking pattern 430 is disposed on a region of the top surface of the third interlayer insulating layer 350, which corresponds to the switching element region 20, and overlaps the second semiconductor layer 310.

The light-blocking pattern 430 prevents external light from entering the second semiconductor layer 310. Accordingly, the malfunction of the first switching unit SW-1 can be prevented. The light-blocking pattern 430 may be formed of the same material and on the same layer as the first gate electrode 410 described above.

The light-blocking pattern 430 is electrically connected to the second gate electrode 120 so as to receive a bias voltage. The light-blocking pattern 430 is made of a conductive material. During the formation of the sensor array substrate 1, electric charges may accumulate in the light-blocking pattern 430 due to static electricity, and the accumulated electric charges may cause the first switching unit SW-1 to malfunction. To prevent the malfunction of the first switching unit SW-1, the electric charges accumulated in the light-blocking pattern 430 may be removed by applying a bias voltage to the light-blocking pattern 430 via the second gate electrode 120.

The second gate electrode 120 and the light-blocking film 430 are electrically connected to each other by a second contact plug 440 which extends from a side of the light-blocking pattern 430 in the direction of the second gate electrode 120. To form the second contact plug 440, a second contact hole 404 (see FIG. 15) which exposes the second gate electrode 120 may be formed in the first interlayer insulating layer 140, the second interlayer insulating layer 250 and the third interlayer insulating layer 350. The second contact plug 440 may be made of the same material as the light-blocking pattern 430.

Referring to FIG. 2, the first source electrode 240 and the second source electrode 330 are electrically connected to each other.

The first and second source electrodes 240 and 330 are electrically connected to each other by a bridge connection pattern which includes a contact pad 510, a first contact pattern 520, and a second contact pattern 530. To form the bridge connection pattern, a third contact hole 406 (see FIG. 16) which exposes part of the first source electrode 240 is formed in the second and third interlayer insulating layers 250 and 350. In addition, a fourth contact hole 408 (see FIG. 16) which exposes part of the second source electrode 330 is formed in the third interlayer insulating layer 350.

Like the first gate electrode 410 and the light-blocking pattern 430, the contact pad 510 is formed on the third interlayer insulating layer 350. In addition, the contact pad 510 and the first and second contact patterns 520 and 530 may be made of the same material as the first gate electrode 410 and the light-blocking pattern 430.

Figure 3:
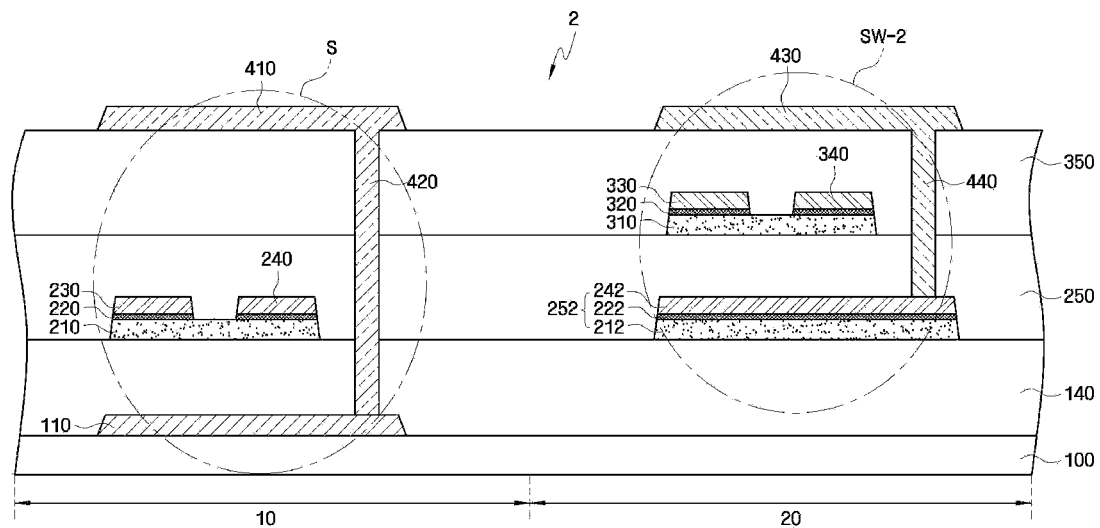
FIG. 3 is a first cross-sectional view of a sensor array substrate according to a second exemplary embodiment of the present invention.
Figure 4:
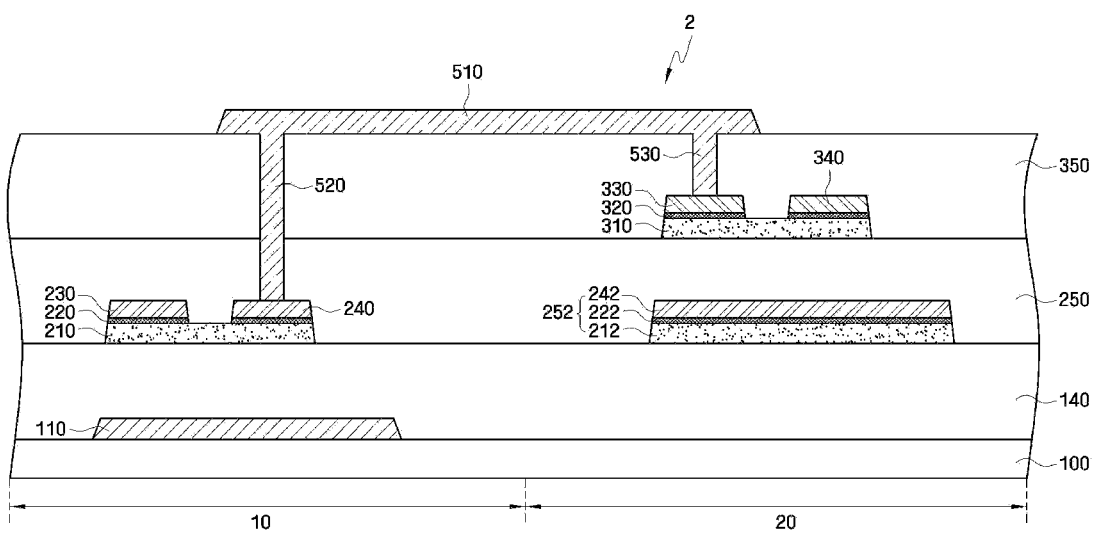
FIG. 4 is a second cross-sectional view of the sensor array substrate according to the second exemplary embodiment of the present invention.

Hereinafter, a sensor array substrate according to a second exemplary embodiment of the present invention will be described with reference to FIGS. 3 and 4. FIG. 3 is a first cross-sectional view of a sensor array substrate 2 according to a second exemplary embodiment of the present invention. FIG. 4 is a second cross-sectional view of the sensor array substrate 2 according to the second exemplary embodiment of the present invention. For the sake of simplicity, elements having the same functions as those illustrated in the drawings of the first exemplary embodiment are indicated by like reference numerals, and thus their description will be omitted.

Referring to FIGS. 3 and 4, the sensor array substrate 2 according to the second exemplary embodiment has substantially the same structure as the sensor array substrate 1 according to the first exemplary embodiment, except for the following features. That is, unlike the first exemplary embodiment where the light-blocking film 110 and the second gate electrode 120 are disposed on the same layer, in the second exemplary embodiment, a light-blocking film 110 and a second gate electrode 252 are disposed on different layers, as shown in FIGS. 3 and 4.

Depending on the number of masks manufactured, the second gate electrode 252 of a second switching unit SW-2 may include a semiconductor pattern 212, an ohmic contact pattern 222, and a conductive pattern 242. Here, the semiconductor pattern 212, the ohmic contact pattern 222, and the conductive pattern 242 may be made of the same materials as a first semiconductor layer 210, an ohmic contact layer pattern 220, and first data wrings 230 and 240, respectively. In addition, the second gate electrode 252 may be formed on the same layer as the first semiconductor layer 210.

Figure 5:
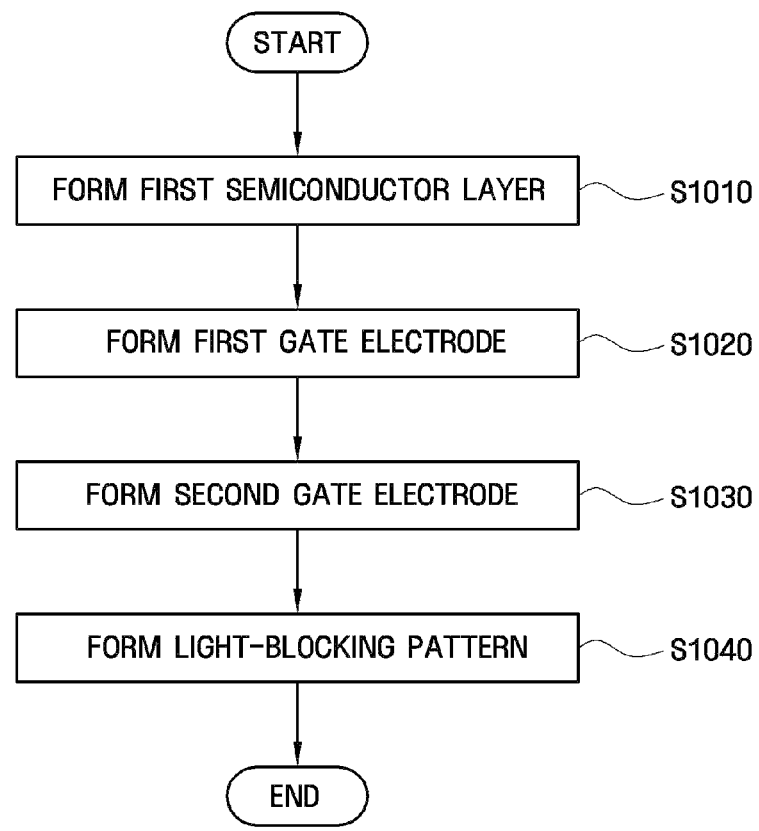
FIG. 5 is a flowchart illustrating a method of fabricating a sensor array substrate according to a third exemplary embodiment of the present invention.

Hereinafter, a method of fabricating a sensor array substrate according to a third exemplary embodiment of the present invention will be described with reference to FIGS. 1, 2, and 5 through 16. FIG. 5 is a flowchart illustrating a method of fabricating a sensor array substrate according to a third exemplary embodiment of the present invention. FIGS. 6 through 16 are cross-sectional views sequentially illustrating processes of the method of fabricating a sensor array substrate according to the third exemplary embodiment of the present invention. For the sake of simplicity, elements having the same functions as those illustrated in the drawings of the first exemplary embodiment are indicated by like reference numerals, and thus their description will be omitted.

Figure 6:
FIG. 6, FIG. 7, FIG. 8, FIG. 9, FIG. 10, FIG. 11, FIG. 12, FIG. 13, FIG. 14, FIG. 15 and FIG. 16 are cross-sectional views sequentially illustrating processes of the method of fabricating a sensor array substrate according to the third exemplary embodiment of the present invention.

Referring to FIGS. 5 and 6, a substrate 100 in which a sensor region 10 that senses light and a switching element region 20 are defined is provided.

A light-blocking film 110 of a sensor unit S is formed in the sensor region 10 of the substrate 100. The light-blocking film 110 may be formed by depositing, e.g., SiGe on the whole surface of the substrate 100 using a chemical vapor deposition (CVD) method and patterning the deposited SiGe using a photolithography process.

Figure 7:
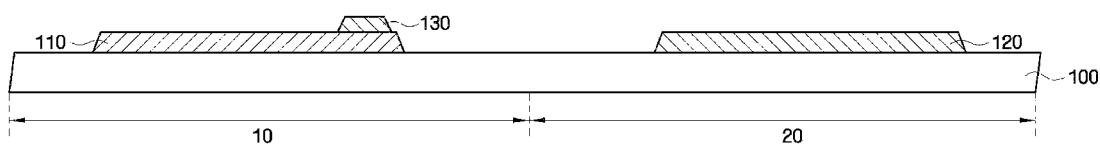

Referring to FIG. 7, a bias voltage application pattern 130 and a second gate electrode 120 are formed on the resultant structure of FIG. 6. The bias voltage application pattern 130 and the second gate electrode 120 may be formed by depositing, e.g., Al/Mo on the resultant structure of FIG. 6 using the CVD method or a sputtering method and by patterning the deposited Al/Mo using a photolithography process. Here, the bias voltage application pattern 130 may be formed on a side of the light-blocking film 110. In addition, the second gate electrode 120 may be formed in a switching element region 20 of the substrate 100. Accordingly, the second gate electrode 120 that controls a first switching unit SW-1 is formed.

Figure 8:
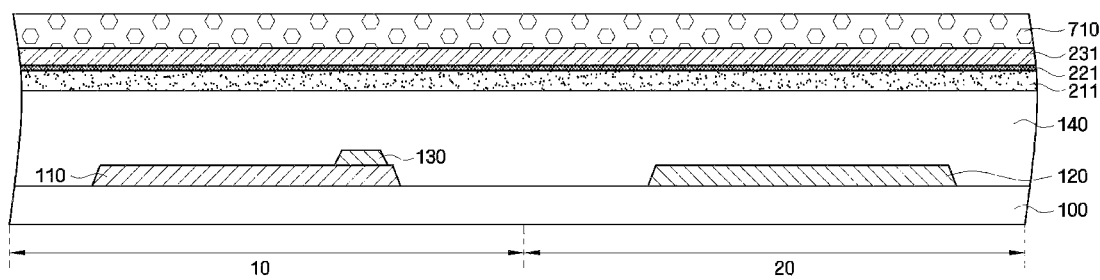

Referring to FIG. 8, a first interlayer insulating layer 140, a first semiconductor film 211, an ohmic contact film 221, and a first conductive film 231 are sequentially stacked on the resultant structure of FIG. 7. In addition, a first photoresist film 710 is formed on the first conductive film 231 so as to pattern the first semiconductor film 211, the ohmic contact film 221, and the first conductive film 231. Here, the first semiconductor film 211 may have a single-film or multi-film structure containing at least one of a-Si, a-SiGe, mc-Si, and semiconductor oxide.

Figure 9:
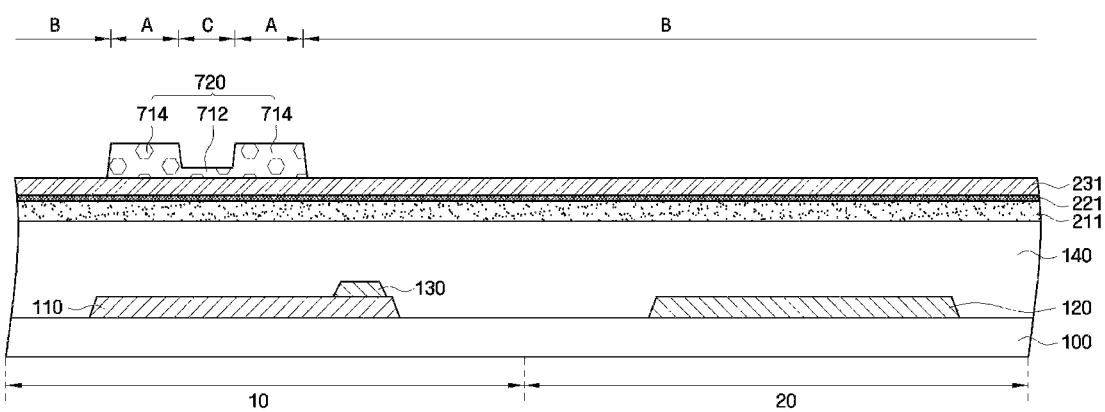

Referring to FIG. 9, the first photoresist film 710 is exposed to light using a mask and is then developed to form a first etch mask 720. The first etch mask 720 may include a first thickness region 712 and a second thickness region 714. Here, the first thickness region 712 refers to a portion of the first etch mask 720 which is located in a channel region C of a thin-film transistor, that is, between a first source electrode 240 (see FIG. 1) and a first drain electrode 230 (see FIG. 1). The second thickness region 714 refers to a portion of the first etch mask 720 which is located in regions where the first source electrode 240 and the first drain electrode 230 are to be formed. The first thickness region 712 is formed thinner than the second thickness region 714. In addition, portions B of the first photoresist film 710 excluding its portions C and A corresponding to the channel region C and the first source and drain electrodes 240 and 230 are all removed. A thickness ratio of the first thickness region 712 and the second thickness region 714 may vary according to processing conditions in etching processes which will be described later.

Various methods may be used to vary the thickness of the first photoresist film 710 according to the position thereof. For example, a mask having slits, a lattice pattern, or a semi-transparent film to control the amount of light that passes therethrough may be used. Alternatively, the first photoresist film 710 may be made of a material that can reflow. In this case, the first photoresist film 710 may be exposed to light by using a conventional mask that is divided into a transparent region through which light can completely pass and a semi-transparent region through which light cannot completely pass. Then, the first photoresist film 710 may be developed and reflowed, so that part of the first photoresist film 710 can flow to a region without the photoresist film 710. As a result, the first thickness region 712 may be formed.

Figure 10:
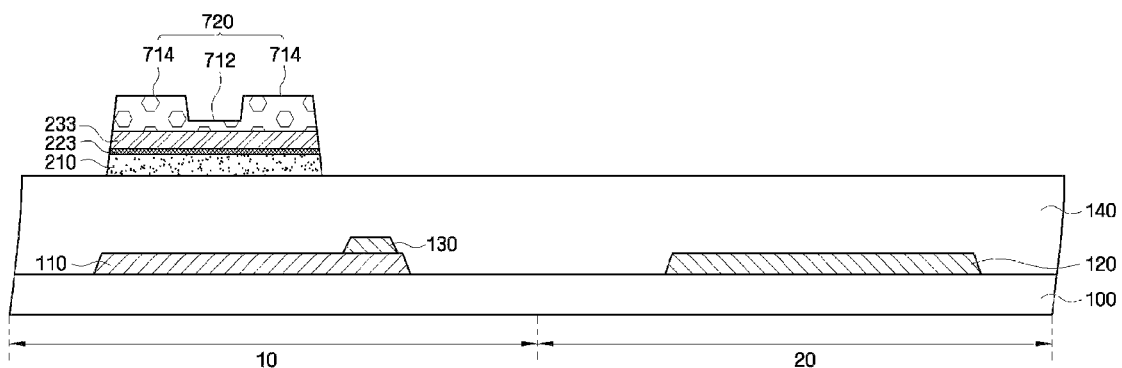

Referring to FIG. 10, a first conductive film pattern 233 is formed by etching the first conductive film 231 using the first etch mask 720. Then, an ohmic contact pattern 223 is formed by etching the ohmic contact film 221. Next, a first semiconductor layer 210 is formed by etching the first semiconductor film 211 (operation S1010). Here, The first conductive film 231, the ohmic contact film 221 and the first semiconductor film 211 may be etched one at a time or simultaneously.

Figure 11:
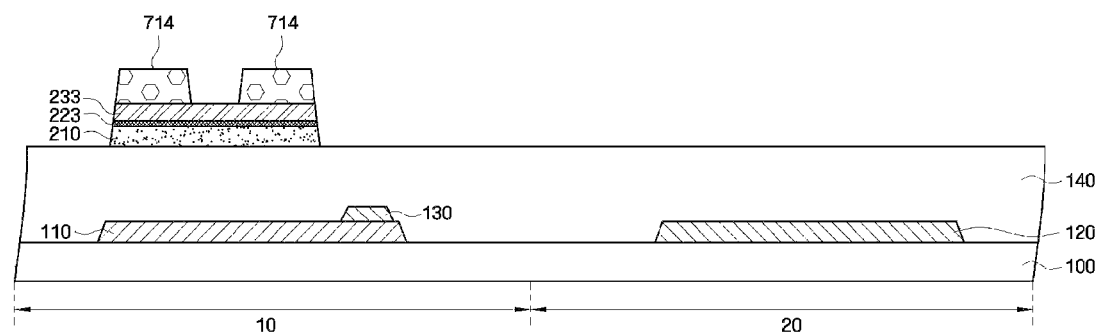

Referring to FIG. 11, the first etch mask 720 is etched back, thereby removing the first thickness region 712. Then, residues of the first photoresist film 710, which remain on a surface of the first conductive film pattern 233 in the channel region C, are removed by an ashing process.

Figure 12:
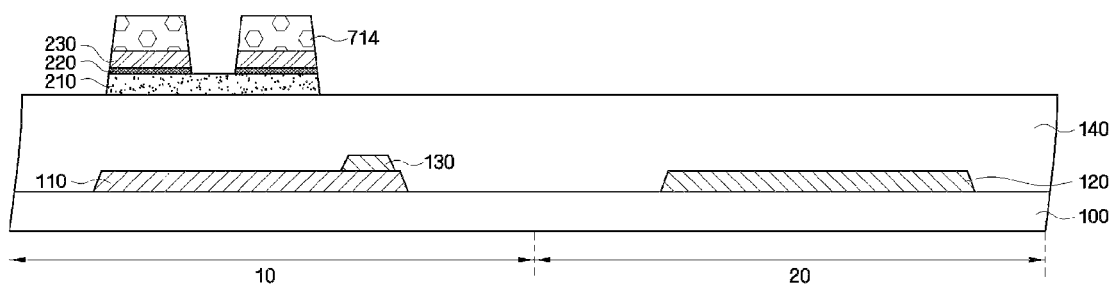

Referring to FIG. 12, a portion of the first conductive film pattern 233, which corresponds to the channel region C, is removed by a wet-etching process or a dry-etching process. In the wet-etching process, a mixture of phosphoric acid, nitric acid and acetic acid or a mixture of hydrofluoric acid (HF) and deionized water may be used as an etchant. In the dry-etching process, a fluorine (F)-based etching gas or a chlorine (Cl)-based etching gas may be used. Examples of the F-based etching gas include $SF_6$, $CF_4$, $XeF_2$, $BrF_2$, and $ClF_2$, and examples of the Cl-based etching gas include $Cl_2$, $BCl_3$, and HCl. As the portion of the first conductive film pattern 233 is removed, the first source electrode 240 and the first drain electrode 230 are separated from each other, thereby completing first data wirings.

Figure 13:
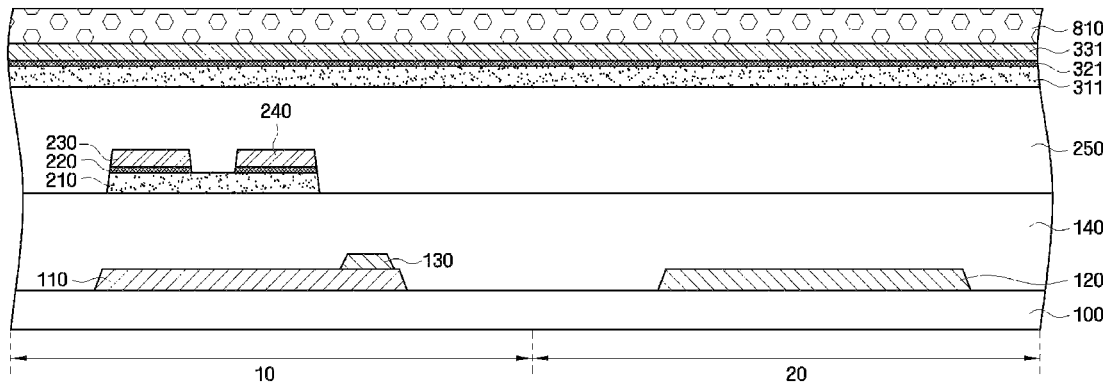

Referring to FIGS. 12 and 13, the first etch mask 714 remaining on the first source electrode 240 and the first drain electrode 230 is removed. Then, a second interlayer insulating layer 250, a second semiconductor film 311, an ohmic contact film 321, and a second conductive film 331 are sequentially stacked. In addition, a second photoresist film 810 is formed on the second conductive film 331 to pattern the second semiconductor film 311, the ohmic contact film 321, and the second conductive film 331. Here, the second semiconductor film 311 may be made of a semiconductor material having different properties from those of the semiconductor material that forms the first semiconductor film 211. For example, the second semiconductor film 311 may be made of a-Si.

Figure 14:
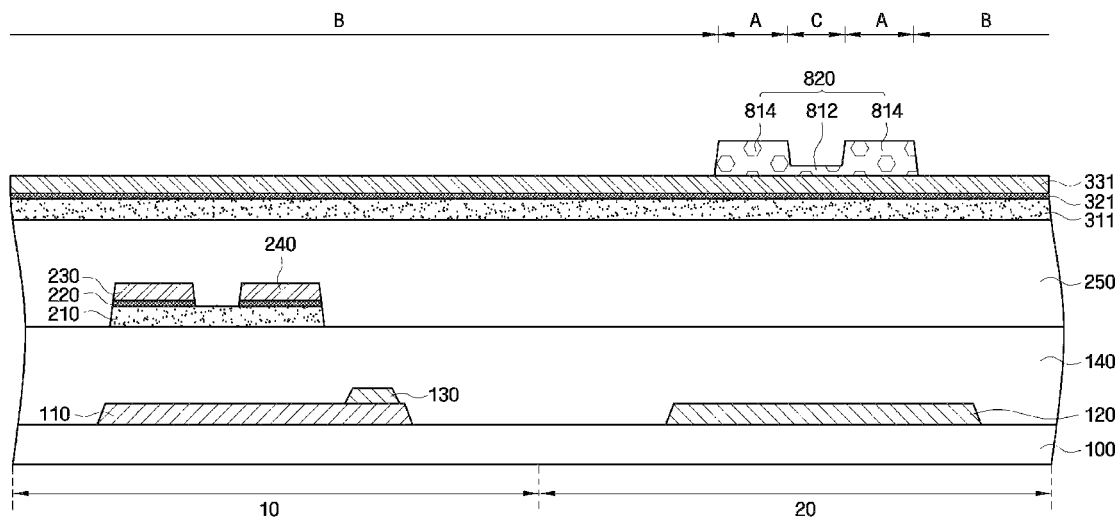

Referring to FIG. 14, the second photoresist film 810 is exposed to light and then developed to form a second etch mask 820 which includes a third thickness region 812 and a fourth thickness region 814. Here, the third thickness region 812 is formed thinner than the fourth thickness region 814. The second etch mask 820 is substantially the same as the first etch mask 720 described above, and thus a redundant description thereof is omitted.

Figure 15:
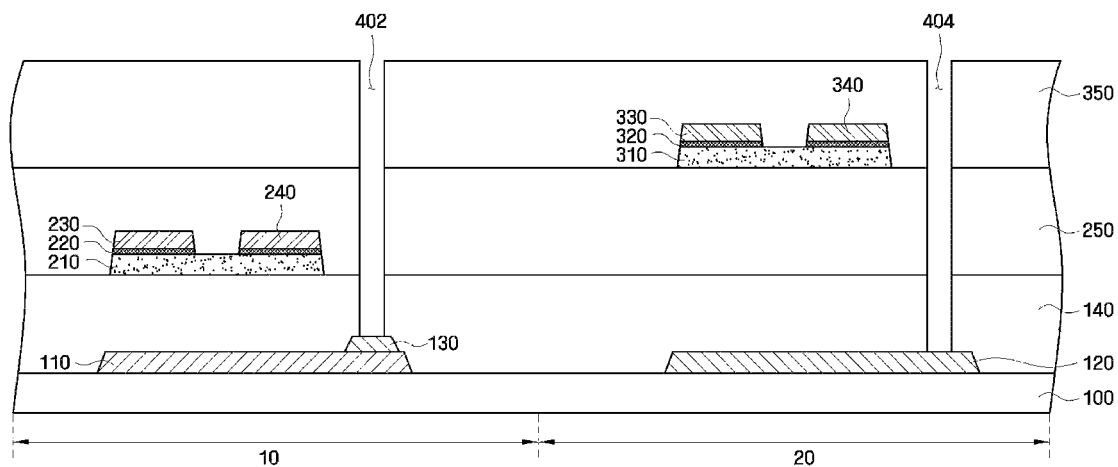

Referring to FIG. 15, the second semiconductor film 311, the ohmic contact film 321, and the second conductive film 331 are etched using the second etch mask 820, thereby forming a second semiconductor layer 310, an ohmic contact layer pattern 320, a second source electrode 330, and a second drain electrode 340. A method of forming the second semiconductor layer 310, the ohmic contact layer pattern 320, the second source electrode 330, and the second drain electrode 340 using the second etch mask 820 is substantially the same as the method of forming the first semiconductor layer 210, the ohmic contact layer pattern 220, the first source electrode 240, and the first drain electrode 230 using the first etch mask 720, and thus a redundant description thereof is omitted.

Next, the second etch mask 820 is removed, and a third interlayer insulating layer 350 is formed to cover the second semiconductor layer 310, the ohmic contact layer pattern 320, the second source electrode 330, and the second drain electrode 340.

Then, a first contact hole 402 is formed in the first interlayer insulating layer 140, the second interlayer insulating layer 250 and the third interlayer insulating layer 350 to expose the bias voltage application pattern 130. In addition, a second contact hole 404 is formed in the first interlayer insulating layer 140, the second interlayer insulating layer 250 and the third interlayer insulating layer 350 to expose part of the second gate electrode 120.

Figure 16:
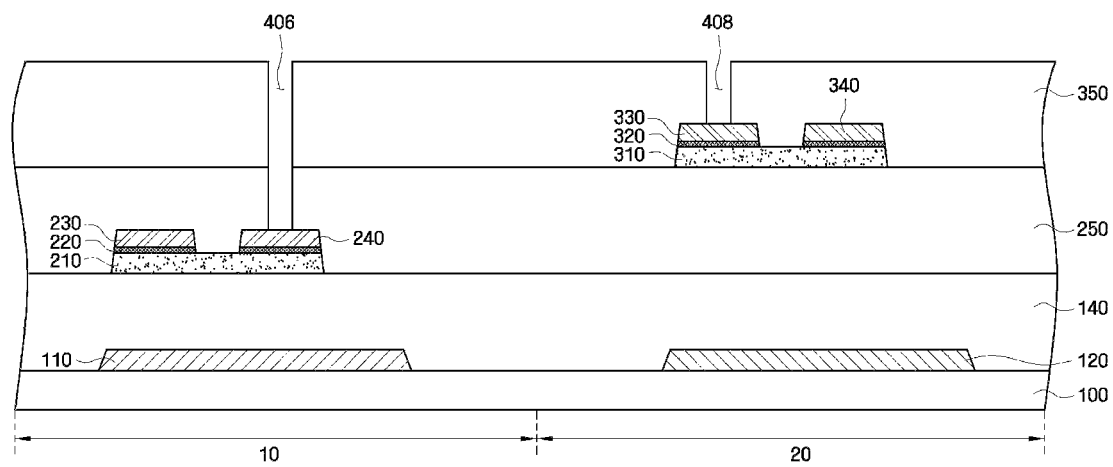

Referring to FIG. 16, a third contact hole 406, which exposes part of the first source electrode 240, is formed in the second and third interlayer insulating layers 250 and 350 in order to electrically connect the first source electrode 240 of the sensor unit S to the second source electrode 330 of the first switching unit SW-1. In addition, a fourth contact hole 408, which exposes part of the second source electrode 330, is formed in the third interlayer insulating layer 350.

Referring to FIGS. 1 and 2, a conductive layer (not shown) is formed on the third interlayer insulating film 350. Here, the first contact hole 402, the second contact hole 404, the third contact hole 406 and the fourth contact hole 408 are filled with a conductive material that forms the conductive layer. Next, the conductive layer is patterned to form a first gate electrode 410, a light-blocking pattern 430, and a contact pad 510.

A first contact plug 420 and a second contact plug 440 are formed in the first contact hole 402 and the second contact hole 404, respectively. The light-blocking film 110 and the first gate electrode 410 are electrically connected to each other by the first contact plug 420. In addition, the second gate electrode 120 and the light-blocking pattern 430 are electrically connected to each other by the second contact plug 440.

Meanwhile, a first contact pattern 520 and a second contact pattern 530 are formed in the third contact hole 406 and the fourth contact hole 408, respectively. Here, an end of the first contact pattern 520 is connected to the first source electrode 240, and the other end of the first contact pattern 520 is connected to the contact pad 510. In addition, an end of the second contact pattern 530 is connected to the second source electrode 330, and the other end of the second contact pattern 530 is connected to the contact pad 510. Accordingly, the first source electrode 240 and the second source electrode 330 are electrically connected to each other by the contact pad 510 and the first and second contact patterns 520 and 530.

When a sensor array substrate is formed according to the current exemplary embodiment, the first semiconductor layer 210 of the sensor unit S and the second semiconductor layer 310 of the first switching unit SW-1 are disposed on different layers. Thus, a semiconductor layer damage preventing film (not shown) used to form the first semiconductor layer 210 or the second semiconductor layer 310 is not required. In addition, according to the current exemplary embodiment, the first semiconductor layer 210, the ohmic contact layer pattern 220, and the first source and drain electrodes 230 and 240 are formed using one mask. Thus, the number of masks used in the entire fabrication process can be reduced.

Hereinafter, a method of fabricating a sensor array substrate according to a fourth exemplary embodiment of the present invention will be described with reference to FIGS. 3, 4, and 17 through 22. FIGS. 17 through 22 are cross-sectional views sequentially illustrating processes of a method of fabricating a sensor array substrate according to a fourth exemplary embodiment of the present invention. For the sake of simplicity, elements having the same functions as those illustrated in the drawings of the first through third exemplary embodiments are indicated by like reference numerals, and thus their description will be omitted.

Figure 17:
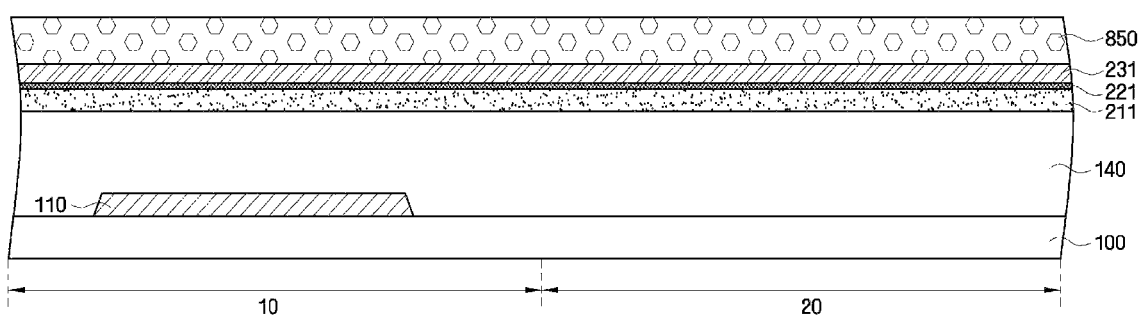
FIG. 17, FIG. 18, FIG. 19, FIG. 20, FIG. 21 and FIG. 22 are cross-sectional views sequentially illustrating processes of a method of fabricating a sensor array substrate according to a fourth exemplary embodiment of the present invention.

Referring to FIG. 17, a light-blocking film 110 is formed in a sensor region 10 of a substrate 100. Then, a first interlayer insulating layer 140, a first semiconductor film 211, an ohmic contact film 221, and a first conductive film 231 are sequentially stacked on the substrate 100 and the light-blocking film 110. In addition, a third photoresist film 850 is formed on the first conductive film 231 to pattern the first semiconductor film 211, the ohmic contact film 221, and the first conductive film 231. Here, the first semiconductor film 211 may have a single-film or multi-film structure containing at least one of a-Si, a-SiGe, mc-Si, and semiconductor oxide.

Figure 18:
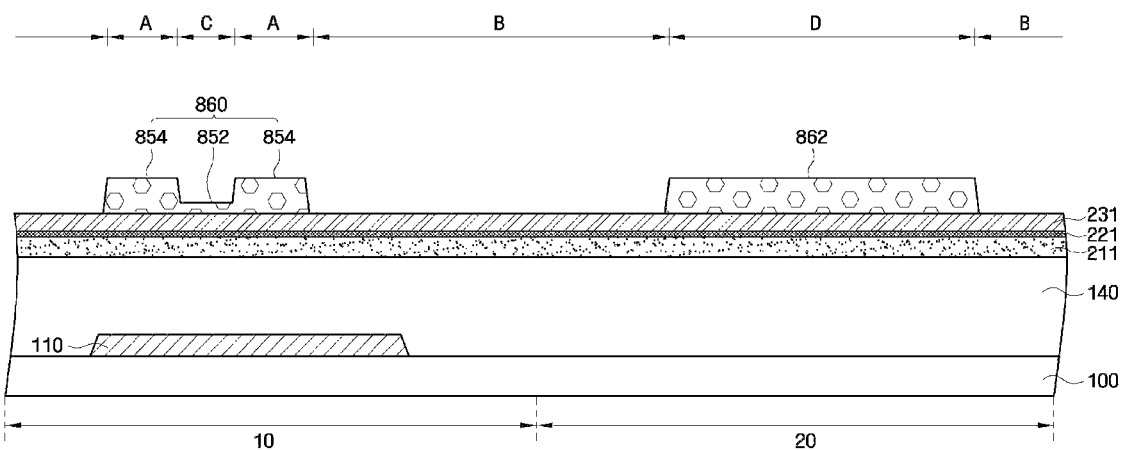

Referring to FIG. 18, the third photoresist film 850 is exposed to light using a mask and is then developed to form third etch masks 860 and 862. The third etch masks 860 and 862 may include a first thickness region 852, a second thickness region 854, and a second gate electrode mask 862. Here, the first thickness region 852 and the second thickness region 854 are substantially the same as the first thickness region 712 and the second thickness region 714 of the third exemplary embodiment, and thus a redundant description thereof is omitted.

The second gate electrode mask 862 is formed in a switching element region 20. The second gate electrode mask 862 may have substantially the same thickness as the second thickness region 854.

That is, portions B of the third photoresist film 850 excluding its portions C, A and D corresponding to the channel region C, first source and drain electrodes 240 and 230, and a second gate electrode 252 (see FIG. 3) are all removed, thereby forming the third etch masks 860 and 862.

Figure 19:
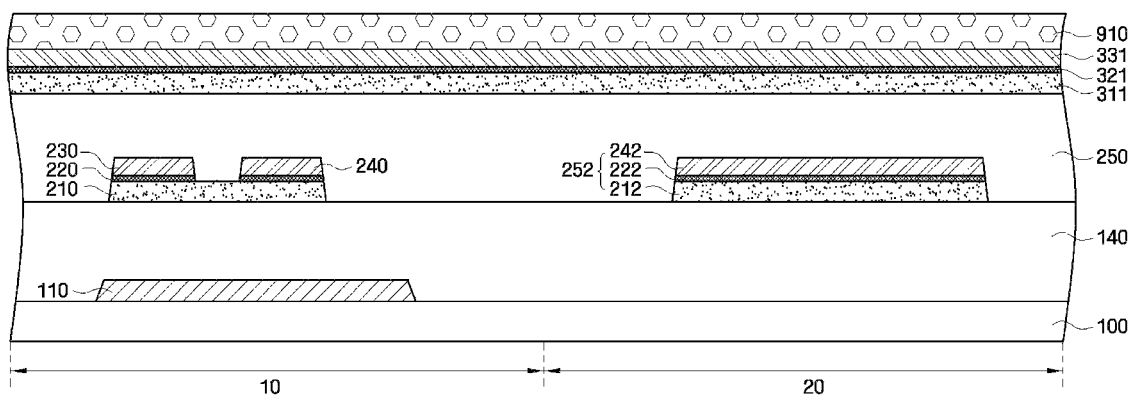

Referring to FIGS. 18 and 19, the first conductive film 231, the ohmic contact film 221, and the first semiconductor film 211 are etched using the third etch masks 860 and 862, thereby forming the first source electrode 240, the first drain electrode 230, an ohmic contact layer pattern 220, and a first semiconductor layer 210. Since this has been described above in the third exemplary embodiment, a redundant description there of is omitted.

The second gate electrode 252 which includes a semiconductor pattern 212, an ohmic contact pattern 222 and a conductive pattern 242 is formed at the same time as when the first source electrode 240, the first drain electrode 230, the ohmic contact layer pattern 220, and the first semiconductor layer 210 are formed. That is, the second gate electrode 252 is formed using the second gate electrode mask 862 in the process of etching the first conductive film 231, the ohmic contact film 221, and the first semiconductor film 211.

Next, a second interlayer insulating layer 250, a second semiconductor film 311, an ohmic contact film 321, and a second conductive film 331 are sequentially stacked on the first source and drain electrodes 240 and 230, the ohmic contact layer pattern 220, the first semiconductor layer 210, and the second gate electrode 252. In addition, a fourth photoresist film 910 is formed on the second conductive film 331 to pattern the second semiconductor film 311, the ohmic contact film 321, and the second conductive film 331. Here, the second semiconductor film 311 may be made of a semiconductor material having different properties from those of the material that forms the first semiconductor film 211.

Figure 20:
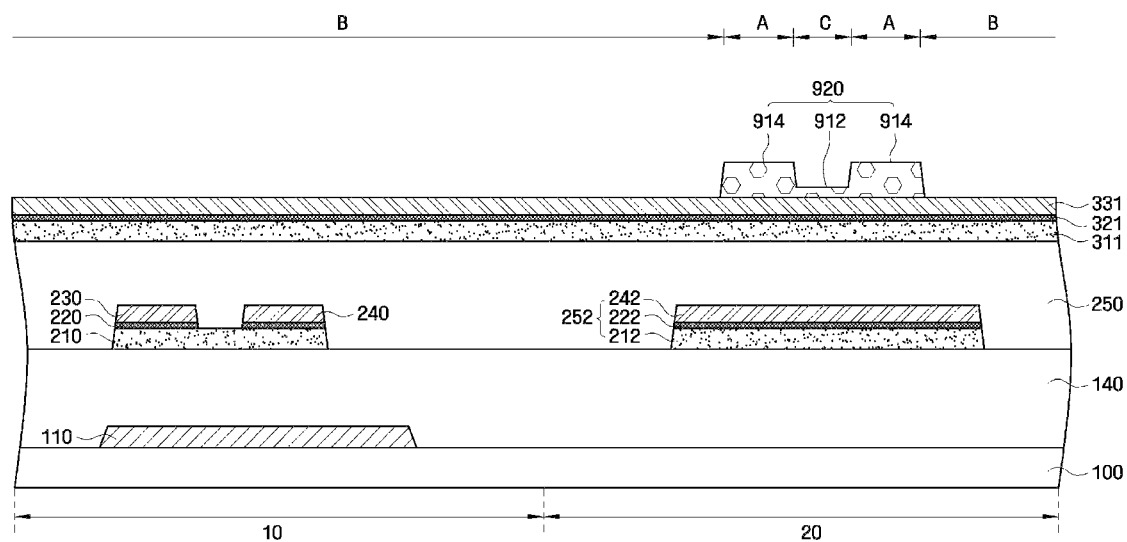

Referring to FIG. 20, a fourth etch mask 920, which has substantially the same shape as the second etch mask 820 described above in the third exemplary embodiment, is formed in the same way as the second etch mask 820.

Figure 21:
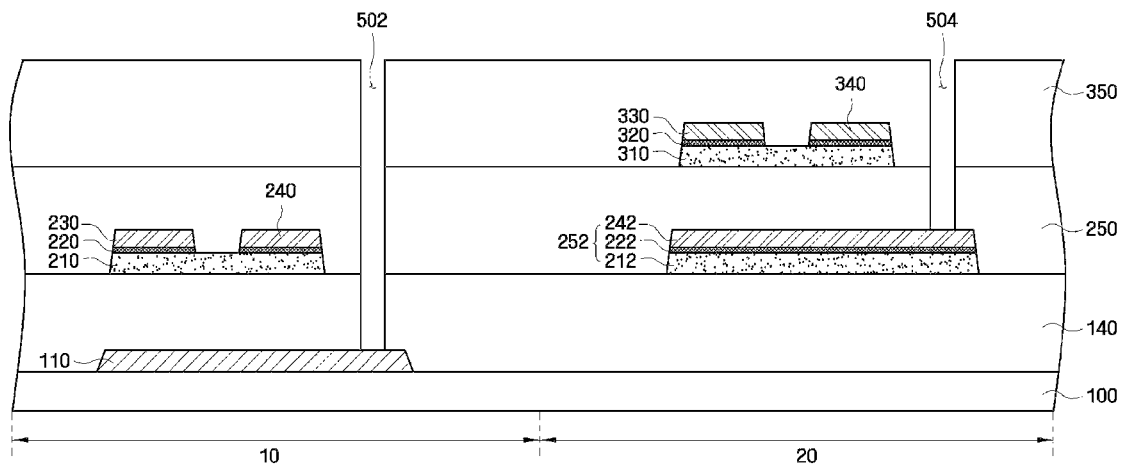

Referring to FIG. 21, the second semiconductor film 311, the ohmic contact film 321, and the second conductive film 331 are patterned using the fourth etch mask 920, thereby forming a second semiconductor layer 310, an ohmic contact layer pattern 320, a second source electrode 330, and a second drain electrode 340.

Next, the fourth etch mask 920 is removed, and a third interlayer insulating layer 350 is formed to cover the second semiconductor layer 310, the ohmic contact layer pattern 320, the second source electrode 330, and the second drain electrode 340.

Then, a first contact hole 502 is formed in the first interlayer insulating layer 140, the second interlayer insulating layer 250 and the third interlayer insulating layer 350 to expose part of the light-blocking film 110. In addition, a second contact hole 504 is formed in the second and third interlayer insulating layers 250 and 350 to expose part of the second gate electrode 252.

Figure 22:
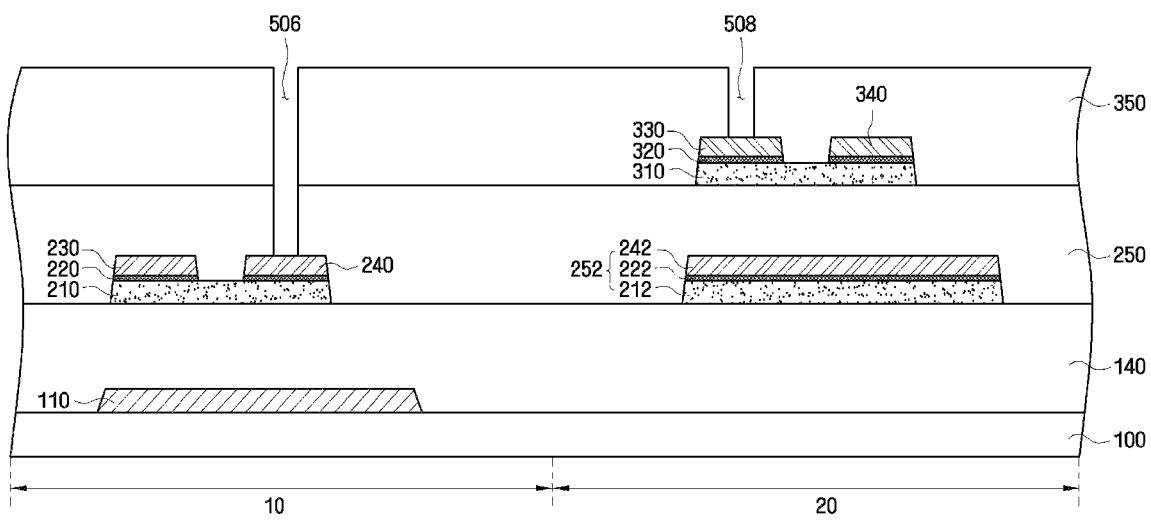

Referring to FIG. 22, a third contact hole 506, which exposes part of the first source electrode 240, is formed in the second and third interlayer insulating layers 250 and 350 in order to electrically connect the first source electrode 240 of a sensor unit S to the second source electrode 330 of a second switching unit SW-2. In addition, a fourth contact hole 508, which exposes part of the second source electrode 330, is formed in the third interlayer insulating layer 350.

Referring to FIGS. 3 and 4, a conductive layer (not shown) is formed on the third interlayer insulating layer 350 and is then patterned to form a first gate electrode 410, a light-blocking pattern 430, and a contact pad 510.

In addition, a first contact plug 420 and a second contact plug 440 are formed in the first contact hole 502 and the second contact hole 504, respectively. The light-blocking film 110 is electrically connected to the first gate electrode 410 by the first contact plug 420, and the second gate electrode 252 is electrically connected to the light-blocking pattern 430 by the second contact plug 440. A first contact pattern 520 and a second contact pattern 530 are formed in the third contact hole 506 and the fourth contact hole 508, respectively. The first source electrode 240 and the second source electrode 330 are electrically connected to each other via the first contact pattern 520, the second contact pattern 530, and the contact pad 510.

When a sensor array substrate is formed according to the current exemplary embodiment, the first semiconductor layer 210 of the sensor unit S and the second semiconductor layer 310 of the second switching unit SW-2 are disposed on different layers. Thus, a semiconductor layer damage preventing film (not shown) used to form the first semiconductor layer 210 or the second semiconductor layer 310 is not required. In addition, according to the current exemplary embodiment, the first semiconductor layer 210, the ohmic contact layer pattern 220, and the first source and drain electrodes 230 and 240 are formed using one mask. Thus, the number of masks used in the entire fabrication process can be reduced. Further, since the second gate electrode 252 is formed when the first semiconductor layer 210 is formed, the number of masks can additionally be reduced.

While the present invention has been particularly shown and described with reference to exemplary embodiments thereof, the exemplary embodiments should be considered in a descriptive sense only and not for purposes of limitation. It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A sensor array substrate, comprising:
   a first semiconductor layer disposed in a first region of a substrate, the first region being configured to sense light;
   a first gate electrode disposed on the first semiconductor layer and overlapping with the first semiconductor layer;
   a second gate electrode disposed in a second region outside the first region;
   a second semiconductor layer disposed on the second gate electrode and overlapping with the second gate electrode; and
   a light-blocking pattern disposed on the second semiconductor layer and overlapping with the second semiconductor layer,
   wherein the first semiconductor layer and the second semiconductor layer are disposed on different layers, and the second gate electrode and the light-blocking pattern are electrically connected to each other.

2. The substrate of claim 1, wherein the first semiconductor layer and the second semiconductor layer comprise different semiconductor materials from each other.

3. The substrate of claim 2, wherein the first semiconductor layer comprises at least one material selected from the group consisting of amorphous silicon germanium (a-SiGe), microcrystalline silicon (mc-Si), and semiconductor oxide.

4. The substrate of claim 1, further comprising a light-blocking film disposed on the substrate and overlapped by the first semiconductor layer.

5. The substrate of claim 4, wherein the light-blocking film and the first gate electrode are electrically connected to each other.

6. The substrate of claim 5, wherein the light-blocking film and the second gate electrode are disposed on the same layer.

7. The substrate of claim 6, further comprising a bias voltage application pattern disposed on the light-blocking film and electrically connected to the first gate electrode.

8. The substrate of claim 5, wherein the light-blocking film and the second gate electrode are disposed on different layers.

9. The substrate of claim 4, wherein the light-blocking film blocks one of a visible light and an infrared light and transmits the other of the visible light and the infrared light.

10. The substrate of claim 9, wherein the light-blocking film is formed as an island-shaped pattern and the boundary of the first semiconductor layer is located within the boundary of the light-blocking film.

11. The substrate of claim 1, further comprising a first source electrode disposed on the first semiconductor layer and a second source electrode disposed on the second semiconductor layer, wherein the first source electrode and the second source electrode are disposed on different layers.

12. The substrate of claim 11, wherein the first source electrode and the second source electrode are electrically connected to each other.

13. The substrate of claim 12, further comprising a bridge connection pattern electrically connecting the first source electrode and the second source electrode to each other, the bridge connection pattern comprising a contact pad.

14. The substrate of claim 13, wherein the contact pad, the first gate electrode, and the light-blocking pattern are disposed on the same layer.

15. The substrate of claim 1, wherein the first semiconductor layer and the second gate electrode are disposed on the same layer.

16. A method of fabricating a sensor array substrate, the method comprising:
forming a first semiconductor layer on a sensor region of a substrate in which a switching element region and the sensor region capable to sense light are defined;
forming a first gate electrode on the first semiconductor layer to overlap the first semiconductor layer;
forming a second gate electrode in the switching element region;
forming a second semiconductor layer on the second gate electrode to overlap the second gate electrode; and
forming a light-blocking pattern on the second semiconductor layer to overlap the second semiconductor layer,
wherein the first semiconductor layer and the second semiconductor layer are disposed on different layers, and the second gate electrode and the light-blocking pattern are electrically connected to each other.

17. The method of claim 16, wherein the first semiconductor layer and the second semiconductor layer comprise different semiconductor materials from each other.

18. The method of claim 17, wherein the first semiconductor layer comprises at least one material selected from the group consisting of a-SiGe, mc-Si, and semiconductor oxide.

19. The method of claim 16, wherein forming the first semiconductor layer comprises:
sequentially forming a first semiconductor film and a first conductive film on the substrate;
forming an etch mask comprising a first thickness region and a second thickness region, on the first conductive film;
etching the first conductive film and the first semiconductor film by using the etch mask;
removing the first thickness region of the etch mask; and
forming a first source electrode by etching a portion of the first conductive film which is disposed under the first thickness region,
wherein the second thickness region is formed on both sides of the first thickness region and is thicker than the first thickness region.

20. The method of claim 19, wherein the etch mask further comprises a second gate electrode mask formed in the switching element region.

21. The method of claim 20, wherein etching the first conductive film and the first semiconductor film comprises forming the second gate electrode.

22. The method of claim 19, wherein forming the second semiconductor layer comprises:
sequentially forming a second semiconductor film and a second conductive film on the substrate;
forming an etch mask comprising a third thickness region and a fourth thickness region, on the second conductive film;
etching the second conductive film and the second semiconductor film by using the etch mask;
removing the third thickness region of the etch mask; and
forming a second source electrode by etching a portion of the second conductive film which is disposed under the third thickness region,
wherein the fourth thickness region is formed on both sides of the third thickness region and is thicker than the third thickness region.

23. The method of claim 22, further comprising:
forming a first contact hole which exposes the first source electrode; and
forming a second contact hole which exposes the second source electrode.

24. The method of claim 23, further comprising:
forming a first contact pattern in the first contact hole to connect the first source electrode and the second source electrode;
forming a second contact pattern in the second contact hole; and
forming a contact pad to electrically connect the first and second contact patterns.

25. The method of claim 16, further comprising:
forming a light blocking film in the sensor region before forming the first semiconductor layer, wherein the first semiconductor layer overlaps the light blocking film;
forming a third contact hole which exposes the light blocking film;
forming a fourth contact hole which exposes the second gate electrode;
forming a first contact plug in the third contact hole to electrically connect the first gate electrode to the light blocking film; and
forming a second contact plug in the fourth contact hole to electrically connect the light blocking pattern to the second gate electrode.

26. The method of claim 25, further comprising:
forming a bias voltage application pattern on the light blocking film,
wherein the bias voltage application pattern is formed of the same material and in the same operation as the second gate electrode, forming the third contact hole exposes the bias voltage application pattern, and forming the first contact plug in the third contact hole electrically connects the first gate electrode to the bias voltage application pattern.

27. A sensor array substrate, comprising:

a substrate comprising a first region and a second region adjacent to the first region;

a sensor unit disposed in the first region and configured to sense light, the sensor unit comprising a first semiconductor layer, a first electrode disposed on the first semiconductor layer, and a first light-blocking film;

a switching unit disposed in the second region, the switching unit comprising a second semiconductor layer, a second electrode disposed on the second semiconductor layer, and a second light-blocking film, wherein the first semiconductor layer and the second semiconductor layer are disposed directly on different layers from each other, and the first electrode and the second electrode are electrically connected to each other.

28. The substrate of claim 27, further comprising:

a first gate electrode disposed on the first electrode and electrically connected to the first light blocking film;

a second gate electrode disposed in the second region and overlapped with the second semiconductor layer, the second gate electrode electrically connected to the second light blocking film, a bridge connection pattern electrically connecting the first electrode and the second electrode to each other, the bridge connection pattern comprising a contact pad, wherein the contact pad, the first gate electrode and the second light-blocking film are disposed directly on the same layer.

29. The substrate of claim 28, wherein the first light-blocking film and the second gate electrode are directly disposed on different layers.

30. The substrate of claim 28, wherein the first light-blocking film and the second gate electrode are directly disposed on the same layer.

31. The substrate of claim 28, wherein the first semiconductor layer and the second gate electrode are directly disposed on the same layer.

* * * * *